United States Patent [19]
Ishido et al.

[11] Patent Number: 5,658,611
[45] Date of Patent: Aug. 19, 1997

[54] SURFACE PROTECTION MATERIAL FOR PRINTED CIRCUIT BOARD AND PROCESS OF FORMING SURFACE PROTECTION FILMS

[75] Inventors: Kiminori Ishido; Masahiro Yamaguchi, both of Tokyo, Japan

[73] Assignee: NEC Corporation, Tokyo, Japan

[21] Appl. No.: 478,668

[22] Filed: Jun. 7, 1995

[30] Foreign Application Priority Data

Jun. 21, 1994 [JP] Japan .................................. 6-138842

[51] Int. Cl.⁶ .................................................. B05D 5/12
[52] U.S. Cl. .................... 427/96; 427/345; 427/372.2; 427/384; 427/409; 205/196
[58] Field of Search .............................. 427/96, 345, 299, 427/256, 409, 372.2, 384; 106/14.16, 14.17; 205/98, 99, 196, 702

[56] References Cited

U.S. PATENT DOCUMENTS

| | | | |
|---|---|---|---|
| 3,791,431 | 2/1974 | Steinbrecher et al. | 148/6.2 |
| 3,839,097 | 10/1974 | Hall et al. | 148/6.2 |
| 4,303,704 | 12/1981 | Courduvelis et al. | 427/345 |
| 5,435,860 | 7/1995 | Maki et al. | 148/269 |

FOREIGN PATENT DOCUMENTS 5186888   7/1993   Japan .

*Primary Examiner*—Shrive Beck
*Assistant Examiner*—Brian K. Talbot
*Attorney, Agent, or Firm*—Sughrue, Mion, Zinn, Macpeak & Seas

[57] ABSTRACT

The surface protection material for printed circuit boards disclosed is one in which a compound having a benzimidazole derivative as an effective component is adjusted to pH range from 1 to 5 with a salt-forming acid and which is an aqueous solution whose metal content of such a heavy metal as copper, manganese and zinc is not higher than 50 ppm. A copper or copper alloy circuit section surface is brought into contact with the surface protection material aqueous solution, and by using an ion exchange resin or by electrolysis, ions of the heavy metal dissolved out of the circuit section surface due to the contact thereof with the surface protection material aqueous solution are removed. The concentration of the heavy metal in the surface protection material aqueous solution is held within 50 ppm. A surface protection film is formed only on the element mounting pad without being formed on a gold plating layer on a terminal, and this enhances the contact reliability of circuits.

3 Claims, 3 Drawing Sheets

SURFACE PROTECTION MATERIAL FOR PRINTED CIRCUIT BOARD AND PROCESS OF FORMING SURFACE PROTECTION FILMS

BACKGROUND OF THE INVENTION (1) Field of the Invention

The present invention relates to a surface protection material for printed circuit boards and also a process for forming surface protection films, and more particularly to a surface protection material used for protection treatment on circuit sections composed of copper or copper alloys, and a process of forming surface protection films using such a surface protection material.

(2) Description of the Related Art

As an available printed circuit board surface protection material (hereinafter referred to as "surface protection material"), which is capable of protecting the copper or copper alloy circuit sections of printed circuit boards and holding the solderbility of the circuit sections, a compound having a benzimidazole derivative as an effective component is disclosed in Japanese Patent Application Kokai Publication No. Hei 5-186888. This surface protection material contains as the effective component 0.05 to 30% by weight of a compound represented by a formula:

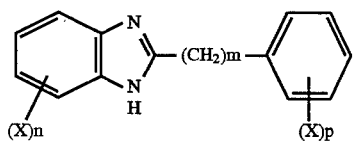

wherein X is a radical, with the number of carbon atoms from 1 to 7, of the group consisting of alkyl group, halogen atoms, amino group, lower diaminoalkyl group, hydroxyl group, lower alkoxyl group, cyano group, acetyl group, benzoyl group, carbamoyl group, formyl group, carboxyl groups, lower alkoxycarboxyl group and nitro group, n and p are integers of 0 to 4, and m is an integer of 1 to 10. Further, the composition contains 100 to 500 ppm of one or more heavy metal salts added as copper complex film coating formation promoter, e.g., copper formate, copper chloride, copper oxalate, copper acetate, copper phosphate, copper sulfate, manganese formate, manganese chloride, manganese oxalate, manganese sulfate, etc. The composition is provided as an organic or inorganic aqueous solution. A surface protection film having this surface protection material composition is formed in the manner similar to the usual coating film formation process. Specifically, the copper or copper alloy circuit surface of printed circuit board is finished by mechanical or chemical polishing, and then the printed circuit board is held dipped in an aqueous solution of surface protection material at 10° to 50° C. for 10 seconds to 10 minutes.

In the surface protection material of a compound with the above benzimidazole as the effective component, a metal salt of copper, manganese, zinc, etc. is added as complex film coating formation promoter for promoting cumulative formation reaction between the copper or copper alloy and the complex film. These metal salts act as catalyst with respect to gold plating layer for contact points and contact of the printed circuit board, and they form a complex film on the gold plating layer surface as well. (Gold is a metal having high oxidization and reduction potentials, and thus it is very stable and generally does not form a complex.) The complex film coating is an insulating film which is not uniform in its thickness. This gives rise to the problems of increasing the contact resistance and reducing the connection reliability of the contact points and the contact gold plating layer surface, and of damaging the appearance of the surface of the gold plating layer due to discoloring. Also, since there is a technical movement for avoiding flux washing of elements after mounting thereof (non-washing trend) because of a trend of abolishing the use of chlorine type organic solvents from the standpoint of environment safeguarding, it has become necessary to avoid the above problems.

SUMMARY OF THE INVENTION

An object of the invention is to provide a surface protection material for printed circuit boards and a process of forming surface protection films, which permit formation of a surface protection film only on a circuit surface without formation of any complex film coating on a gold plating layer surface, are free from reduction of the connection reliability and discoloring of the gold plating layer surface, permit avoiding the use of chlorine type organic solvents, and can ensure high safety.

According to one aspect of the invention, there is provided a surface protection material for printed circuit boards, in which a compound having a benzimidazole derivative as an effective component and being represented by a general formula of

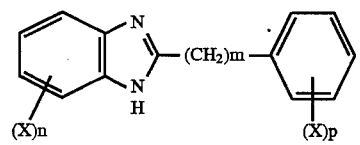

(wherein X is a radical, with the number of carbon atoms from 1 to 7, of the group consisting of alkyl group, halogen atoms, amino group, lower dialkylamino group, lower alkoxyl group, cyano group, acetyl group, benzoyl group, carbamoyl group, formyl group, carboxyl group., lower alkoxylcarbonyl group and nitro group, n and p are integers of 0 to 4, and m is an integer of 1 to 10) is adjusted to pH range from 1 to 5 with a salt-forming acid and which is an aqueous solution whose metal content of a heavy metal, from the group consisting of copper, manganese and zinc, is not higher than 50 ppm.

According to the invention, an aqueous solution surface protection material containing less than 50 ppm of such a heavy metal as copper, manganese, zinc, etc. produced from a compound containing as the effective component a benzimidazole derivative by adjusting the pH of the saltforming acid to 1 to 5, is brought into contact as a surface protection material with the circuit section surface, and ions of copper or like heavy metal dissolved out of the circuit section surface as a result of the contact are removed, thus holding the concentration of copper or like heavy metal containing copper within 50 ppm. It is thus possible to form the surface protection film only on the circuit section made of copper or a copper alloy without formation of the surface protection film on a gold plating layer on a terminal, thus permitting suppression of contact resistance increase or discoloring of the gold plating layer for contact points of contact of the circuit section, enhancing the contact reliability, dispensing with the use of any chlorine type organic solvent after mounting of elements, and the maintenance of the safety.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be described with reference to the drawings.

Figure 1A:
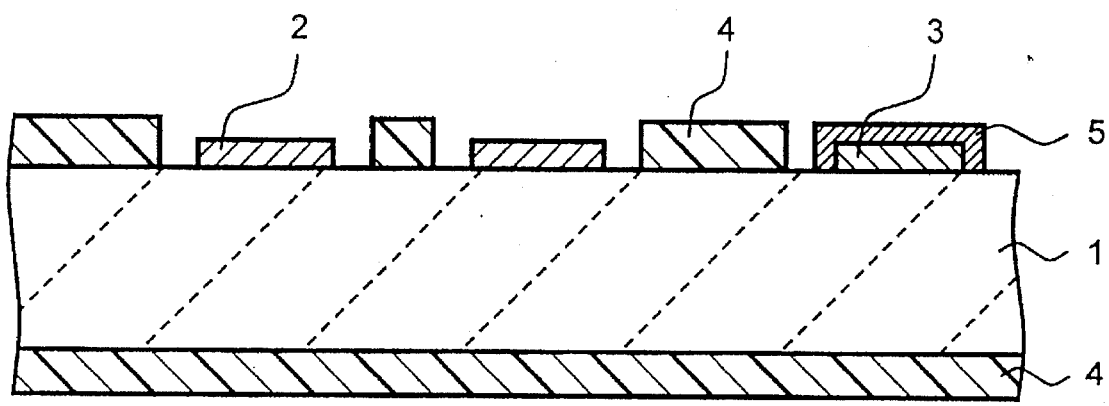
FIGS. 1A and 1B are sectional views of a printed circuit board for describing a surface protection film formation process of a first embodiment according to the invention.
Figure 1B:
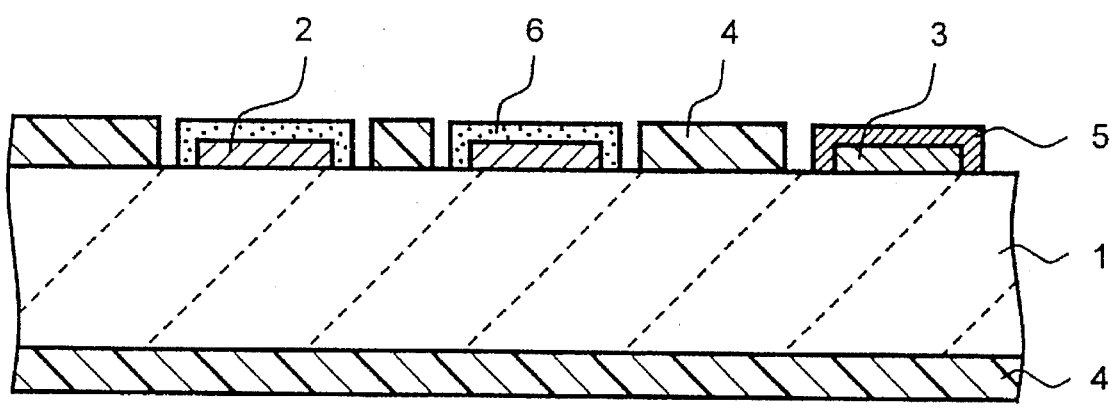

FIGS. 1A and 1B show in sectional views a printed circuit board for describing a surface protection film coating formation process of the first embodiment of the invention. In this process, as shown in FIG. 1A, first a copper or copper alloy circuit section containing an element mounting pad 2 and a terminal 3 is formed on an insulating substrate 1 at a predetermined position thereof. Then, the surface of the electrode 3 is covered with an electrolytic gold plating layer 5 formed by electrolytic gold plating. Then, a solder resist layer 4 is formed on a portion of the substrate surface other than the areas of the element mounting pad 2 and the terminal 3 which is covered by the electrolytic gold plating layer 5. Subsequently, an oxide film formed on the copper or copper alloy circuit section surface containing the element mounting pad 2 is removed. This is done by chemical polishing. More specifically, the structure being processed is held dipped in a mixed solution containing hydrogen peroxide and sulfuric acid (hydrogen peroxide: 35 g/L, sulfuric acid: 100 g/L, the remainder being water) at 25° C. for 15 to 40 seconds for purifying and surface roughening, followed by washing with pure water, then water removal, and then infrared radiation drying or hot air drying at 130° C. for 20 seconds. Alternatively, the removal of the oxide film and surface roughening may be carried out by mechanical polishing such as sand blasting.

Afterwards, the structure being processed is held dipped in an aqueous solution of a surface protection material having a composition, which contains as the effective component 0.05 to 30% by weight, preferably 1 to 5% by weight, of a benzimidazole compound as represented by a formula:

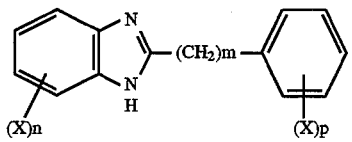

wherein X is a radical, with the number of carbon atoms from 1 to 7, of the group consisting of alkyl group, halogen atoms, amino group, lower diaminoalkyl group, hydroxyl group, lower alkoxyl group, cyano group, acetyl group, benzoyl group, carbamoyl group, formyl group, carboxyl group, lower alkoxycarboxyl group and nitro groups, n and p are integers of 0 to 4, and m is an integer of 1 to 10, and the pH of which has been adjusted to 1 to 5 with a salt-forming organic acid, such as copper formate, acetic acid, propionic acid, butylic acid, glycolic acid, lactic acid, chloroacetic acid, dichloroacetic acid, trichloroacetic acid, bromoacetic acid, fluroacetic acid, difluoroacetic acid, trifluoroacetic acid, oxalic acid, maronic acid, succinic acid, adipic acid, malic acid, tartaric acid, citric acid, maleic acid, fumaric acid, paratoluene sulfonic acid, methane sulfonic acid, etc., or a salt-forming organic acid, such as chloric acid, sulfuric acid, phosphoric acid, phosphorous acid, hypophosphorous acid, nitric acid, etc. The dipping may be made in a temperature range of 0° to 60° C. with a preferred range being 10° to 50° C. The dipping time is 5 seconds to one hour, preferably 10 seconds to 10 minutes. Subsequently, the structure being processed is washed with pure water, then water is removed, and then the structure is hot air dried. As a result, a surface protection film 6 with a thickness of 0.2 to 0.5 μm is formed only on the copper or copper alloy circuit section surface inclusive of the element mounting pad 2, as shown in FIG. 1B.

Figure 3:
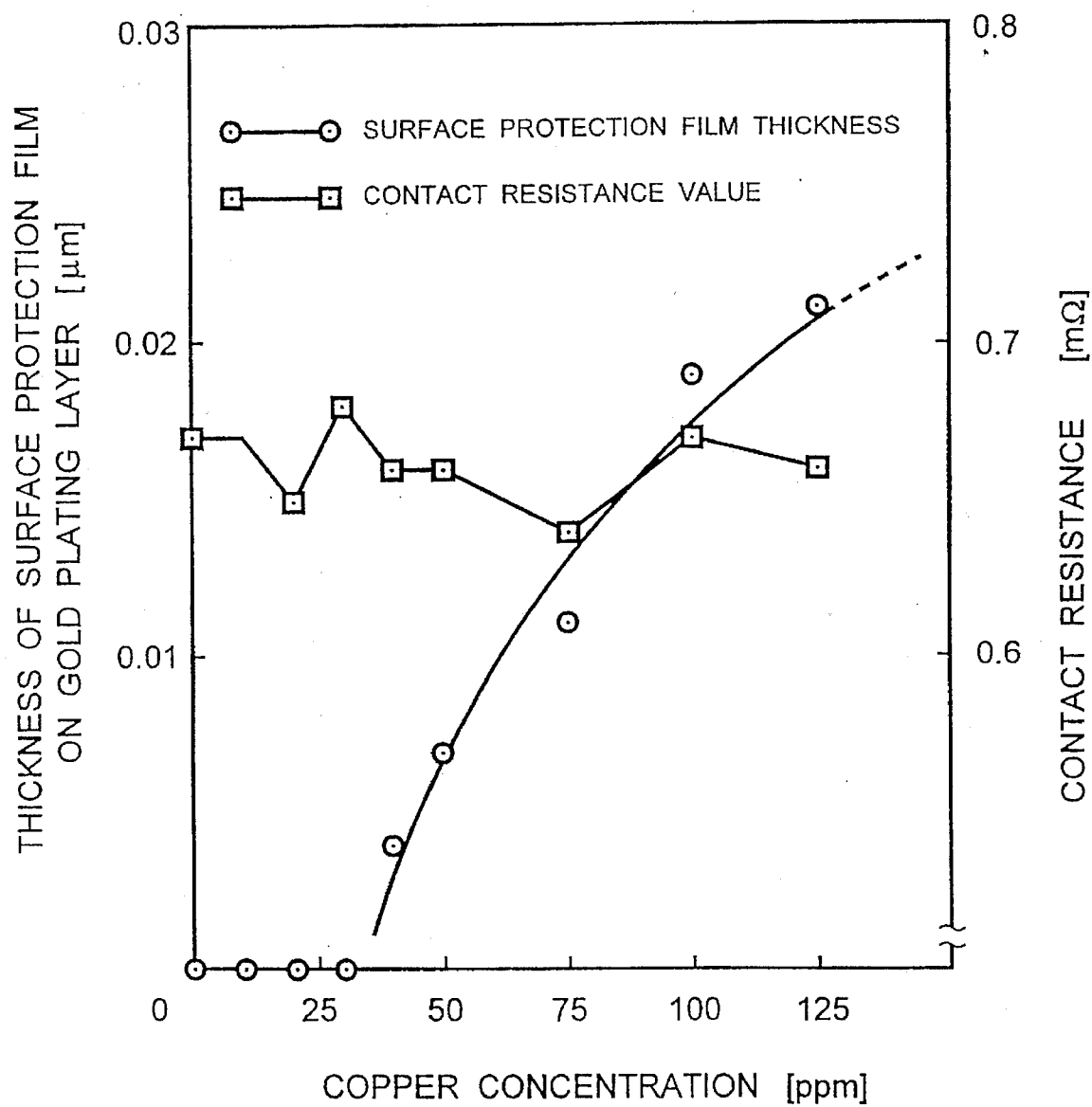
FIG. 3 is a graph showing the relationship of the thickness of surface protection film formed on a gold plating layer and the contact resistance to the copper concentration in a surface protection material aqueous solution according to the invention.

FIG. 3 is a graph showing the relationship of the thickness of the surface protection film formed on the gold plating layer surface and the contact resistance to the copper concentration of the aqueous solution of the surface protection material according to the invention. The evaluation was made by using a nickel layer of 2 μm and an electrolytic gold plating layer of 1 μm. As conditions for the contact resistance measurement, a constant current of 10 mA was applied, the measurement weight was set to 50 g, and the probe was scanned at a rate of 1 mm/min. As shown in FIG. 3, with a surface protection film thickness of 0.01 μm, no substantial increase of the contact resistance could be noted. On the other hand, the surface protection film thickness was increased with an increase in copper concentration of the surface protection material aqueous solution. When the concentration exceeded 50 ppm, pronounced discoloring of the gold plating layer was noted. Thus, the content of heavy metal, such as copper, manganese, zinc, etc., in the surface protection material aqueous solution is held within 50 ppm. Further, in the formation of the surface protection film, ions of heavy metal, such as copper, manganese, zinc, etc., dissolved out of the circuit section and like section of the insulating substrate due to the contact thereof with the surface protecting material aqueous solution, are removed by using an ion exchange resin or through electrolysis. Thus, the heavy metal concentration of the surface protection material aqueous solution is held within 50 ppm at all times.

Figure 2A:
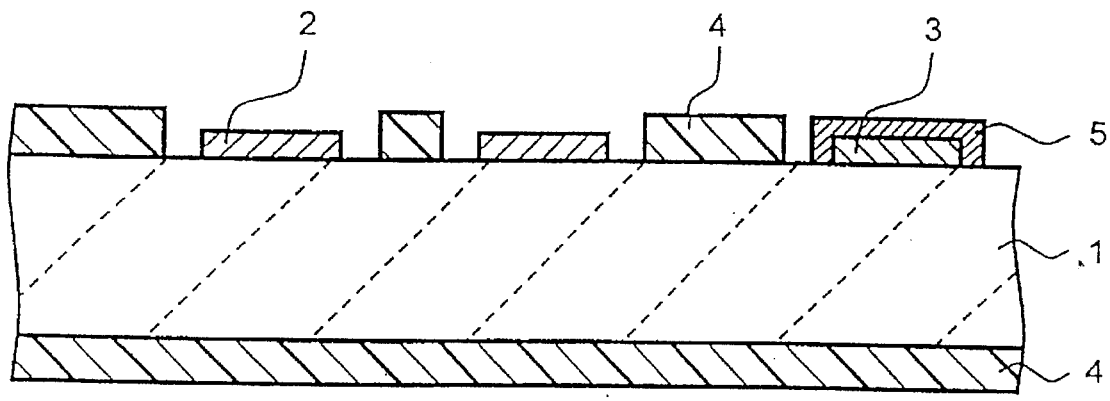
FIGS. 2A, 2B and 2C are sectional views of a printed circuit board for describing a surface protection film formation process of a second embodiment according to the invention.
Figure 2B:
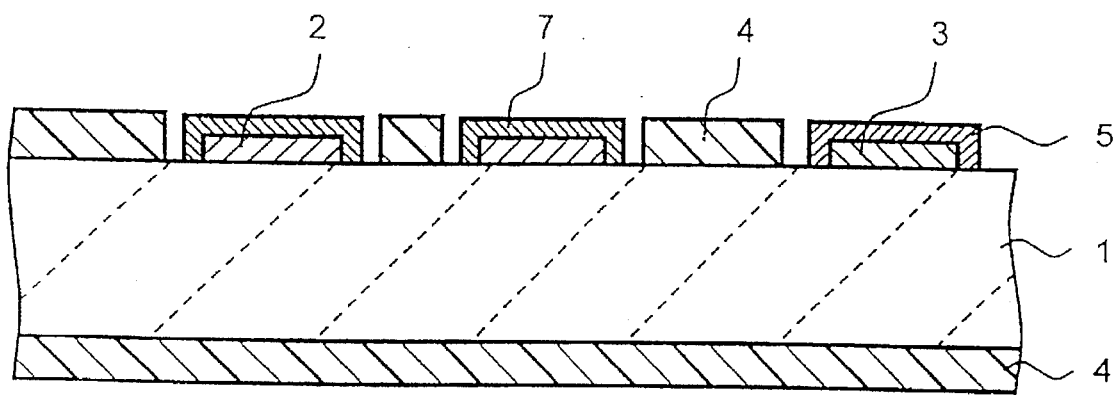
Figure 2C:
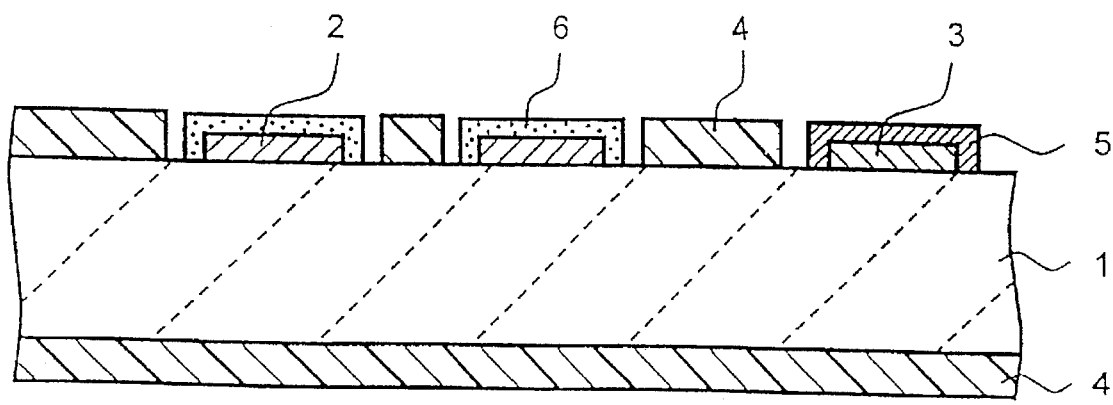

FIGS. 2A, 2B and 2C show, in sectional views, the structure being fabricated for sequentially describing a surface protection film formation process of the second embodiment according to the invention. The process is again for forming a surface protection film on a printed circuit board. First, as shown in FIG. 2A, a copper or copper alloy circuit section containing an element mounting pad 2 and a terminal 3 is formed on an insulating substrate 1 at a predetermined position thereof. Then, the surface of the terminal 3 is covered with an electrolytic gold plating layer 5 formed by electrolytic gold plating. Then, a solder resist layer 4 is formed on an area other than the areas of the element mounting pad 2 and the terminal 3 covered with the electrolytic gold plating layer 5. Subsequently, oxide film formed on the surface of the copper or copper alloy circuit section inclusive of the element mounting pad 2 is removed for purification. More specifically, the structure being processed is held dipped in a mixed solution of hydrogen peroxide, sulfuric acid and a chain organic acid represented by a formula R—COOH (R being an alkyl group with a carbon number of 3 or above) (hydrogen peroxide: 35 g/L, sulfuric acid: 100 g/L, organic acid: 10 g/L, the remainder being water) at 25° C. for 15 to 40 seconds. In this way, the oxide film is removed and, at the same time, a primary corrosion-proof layer 7, i.e., a single molecular film of an organic acid of copper, is formed, as shown in FIG. 2B. With the formation of the primary corrosion-proof film 7, it is possible to prevent under-water oxidization in the water washing which is carried out in the next step. Then, chemical polishing is carried out after the sequential processes of washing with pure water, removing of water, and drying by infrared radiation or hot air at 130° C. for 20 seconds.

Afterwards, the structure being processed is held dipped in an aqueous solution of a surface protection material having a composition, which contains as effective component 0.05 to 30% by weight, preferably 1 to 5% by weight, of a benzimidazole compound as represented by a formula:

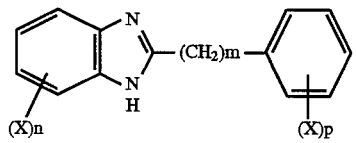

wherein X is a radical, with the number of carbon atoms from 1 to 7, of the group consisting of alkyl group, halogen atoms, amino group, lower diaminoalkyl group, hydroxyl group, lower alkoxyl group, cyano group, acetyl group, benzoyl group, carbamoyl group, formyl group, carbooxyl group, lower alkoxycarboxyl group and nitro group, n and p are integers of 0 to 4, and m is an integer of 1 to 10, and the pH of which has been adjusted to 1 to 5 with a salt-forming organic acid, such as copper formate, acetic acid, propionic acid, butylic acid, glycolic acid, lactic acid, chloroacetic acid, dichloroacetic acid, trichloroacetic acid, bromoacetic acid, fluoroacetic acid, difluoroacetic acid, trifluoroacetic acid, oxalic acid, maronic acid, succinic acid, adipic acid, malic acid, tartaric acid, citric acid, maleic acid, fumaric acid, paratoluene sulfuric acid, methane sulfonic acid, etc., or a salt-forming acid, such as chloric acid, sulfuric acid, phosphoric acid, phosphorous acid, hypophosphorous acid, nitric acid, etc. The dipping may be made in a temperature range of 0° to 60° C. The dipping time is 5 seconds to one hour, preferably 10 seconds to 10 minutes. Subsequently, the structure being processed is washed with pure water, then water is removed, and then the structure being processed is hot air dried. As a result, a surface protection film 6 with a thickness of 0.2 to 0.5 μm is formed only on the copper or copper alloy circuit section surface inclusive of the element mounting pad 2, as shown in FIG. 2C.

Again in this embodiment, like the previous first embodiment, according to the results shown in FIG. 3 and the discoloring of the gold plating layer, the content of heavy metal, such as copper, manganese, zinc, etc., in the surface protection material aqueous solution is held within 50 ppm, and further in the formation of the surface protection film ions of heavy metal, such as copper, manganese, zinc, etc., dissolved out of the circuit section and like element of the insulating substrate due to contact between the surface protection material and aqueous solution, are removed by using an ion exchange resin or through electrolysis. Thus, the heavy metal concentration in the surface protection material aqueous solution is held within 50 ppm at all times.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A process of forming a surface protection film on a copper or copper alloy circuit section surface of a printed circuit board, but suppressing formation of said surface protection film on a gold or gold alloy circuit section surface of said printed circuit board, said process comprising the steps of:

purifying and roughening said copper or copper alloy circuit section surface by one of chemical polishing and mechanical polishing;

bringing the polished and toughened copper or copper alloy circuit section surface and the gold or gold alloy circuit section surface to be in contact with a surface protection material aqueous solution for printed circuit boards, the surface protection material being one in which a compound having a benzimidazole derivative as an effective component and being represented by a general formula of

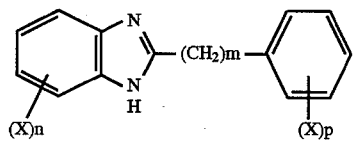

(wherein X is a radical, with the number of carbon atoms from 1 to 7, of the group consisting of alkyl group, halogen atoms, amino group, lower dialkylamino group, lower alkoxyl group, cyano group, acetyl group, benzoyl group, carbamoyl group, formyl group, carboxyl group, lower alkoxylcarbonyl group and nitro group, n and p are integers of 0 to 4, and m is an integer of 1 to 10) is adjusted to pH range from 1 to 5 with a salt-forming acid and which is an aqueous solution whose metal content of a heavy metal, where the heavy metal is copper, manganese or zinc, is not higher than 50 ppm; and washing, water-removing and drying of the circuit board being processed;

whereby said film is formed over said copper or copper alloy circuit section surface, and said film is suppressed from being formed over said gold or said gold alloy circuit section surface.

2. The process of forming a surface protection film for a printed circuit board according to claim 1, in which the step of bringing the copper or copper alloy circuit section surface to be in contact with the surface protection material aqueous solution comprises the processes of:

removing, by using an ion exchange resin, ions of a copper contained in a heavy metal and dissolved out of the circuit section surface due to the contact thereof with the surface protection material aqueous solution; and holding the concentration of said heavy metal in the surface protection material aqueous solution within 50 ppm.

3. The process of forming a surface protection film for a printed circuit board according to claim 1, in which the step of bringing the copper or copper alloy circuit section surface to be in contact with the surface protection material aqueous solution comprises the processes of:

removing, by electrolysis, ions of a copper contained in a heavy metal and dissolved out of the circuit section surface due to the contact thereof with the surface protection material aqueous solution; and holding the concentration of said heavy metal in the surface protection material aqueous solution within 50 ppm.

* * * * *